United States Patent
Smeys et al.

(10) Patent No.: US 9,862,593 B2
(45) Date of Patent: Jan. 9, 2018

(54) MEMS-CMOS DEVICE THAT MINIMIZES OUTGASSING AND METHODS OF MANUFACTURE

(71) Applicant: INVENSENSE, INC., San Jose, CA (US)

(72) Inventors: Peter Smeys, San Jose, CA (US); Jong Il Shin, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/366,495

(22) Filed: Dec. 1, 2016

(65) Prior Publication Data

US 2017/0073217 A1    Mar. 16, 2017

Related U.S. Application Data

(62) Division of application No. 14/748,012, filed on Jun. 23, 2015, now Pat. No. 9,540,228.

(60) Provisional application No. 62/109,476, filed on Jan. 29, 2015.

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81B 2207/012* (2013.01); *B81B 2207/094* (2013.01); *B81C 2201/013* (2013.01); *B81C 2201/016* (2013.01); *B81C 2201/0133* (2013.01); *B81C 2203/035* (2013.01); *B81C 2203/0792* (2013.01)

(58) Field of Classification Search
CPC .. B81B 7/0032; B81B 7/0077; B81C 1/00222
See application file for complete search history.

(56) References Cited

U.S. PATENT DOCUMENTS

| 9,266,714 | B2 | 2/2016 | Shu et al. |
| 9,365,416 | B2 | 6/2016 | Shu et al. |
| 9,540,228 | B2 * | 1/2017 | Smeys .................. B81B 7/0041 |

(Continued)

FOREIGN PATENT DOCUMENTS

| TW | 201307185 A | 2/2013 |
| TW | 201335059 A | 9/2013 |

OTHER PUBLICATIONS

International Search Report and Written Opinion for PCT Application No. PCT/US2016/014143 dated Apr. 6, 2016, 12 pages.

(Continued)

*Primary Examiner* — Mark Prenty
(74) *Attorney, Agent, or Firm* — Amin, Turocy & Watson, LLP

(57) ABSTRACT

A MEMS device is disclosed. The MEMS device includes a first substrate. At least one structure is formed within the first substrate. The first substrate includes at least one first conductive pad thereon. The MEMS device also includes a second substrate. The second substrate includes a passivation layer. The passivation layer includes a plurality of layers. A top layer of the plurality of layers comprises an outgassing barrier layer. At least one second conductive pad and at least one electrode are coupled to the top layer. At least one first conductive pad is coupled to the at least one second conductive pad.

19 Claims, 10 Drawing Sheets

(56) References Cited

U.S. PATENT DOCUMENTS

2013/0214400 A1 8/2013 Shu et al.
2014/0151820 A1 6/2014 Howe et al.

OTHER PUBLICATIONS

Office Action for U.S. Appl. No. 14/748,012 dated Jun. 23, 2016, 9 pages.
Taiwanese Office Action for Taiwanese Application No. 105102472 dated Oct. 11, 2016, 12 pages (including translation).

* cited by examiner

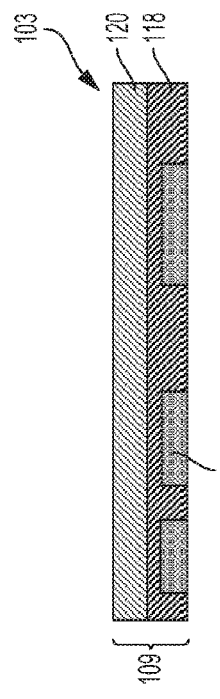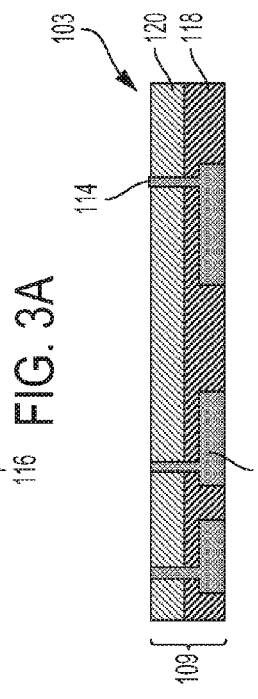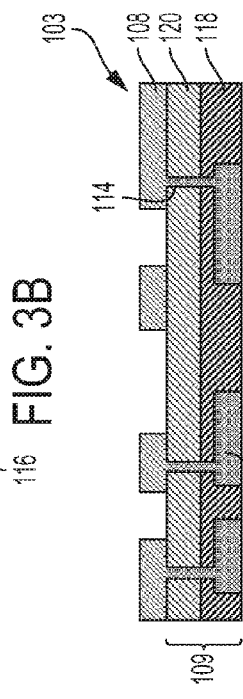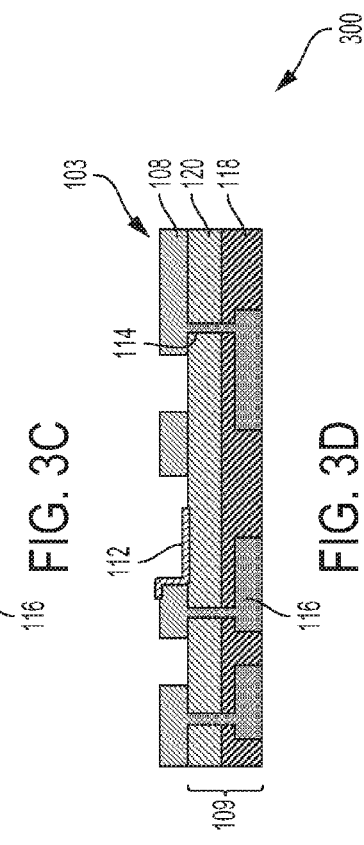

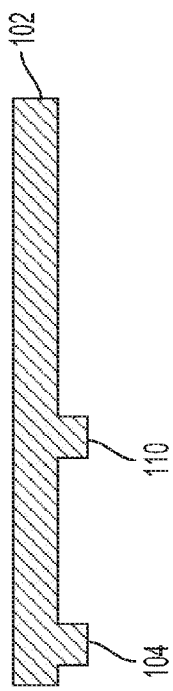
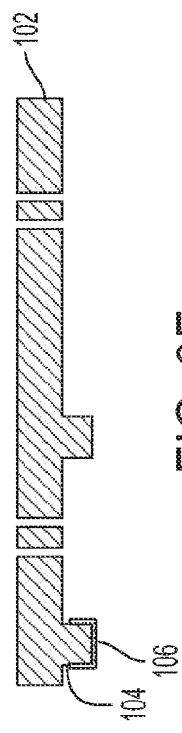
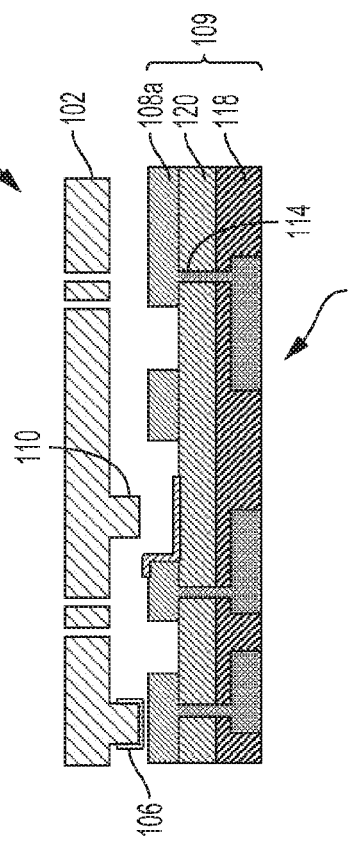

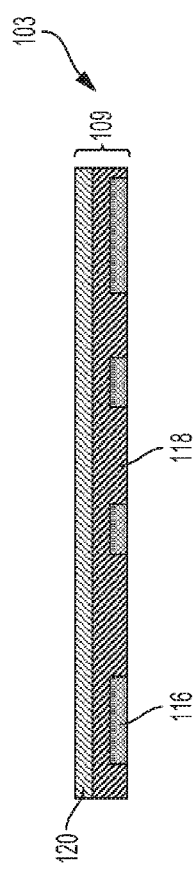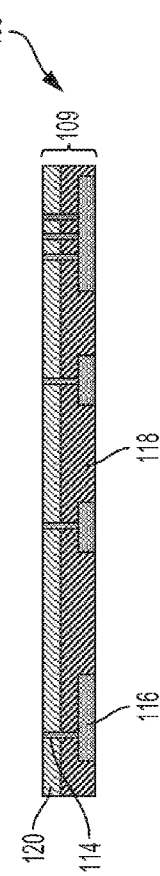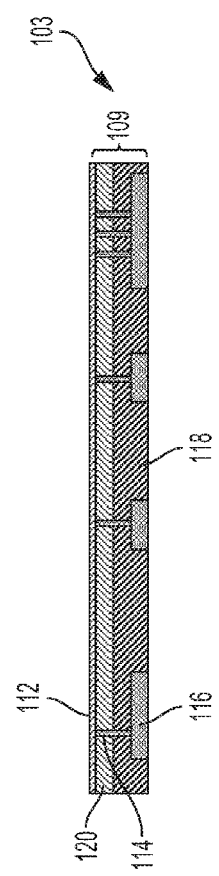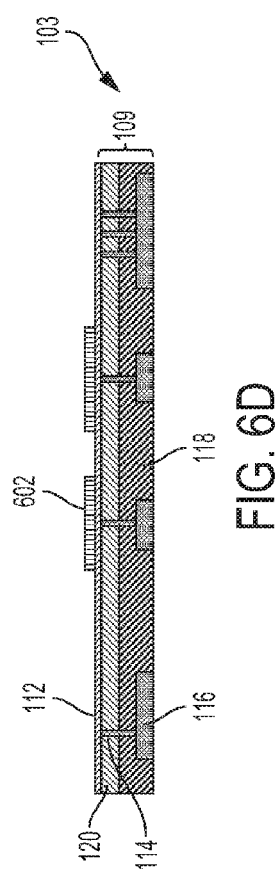

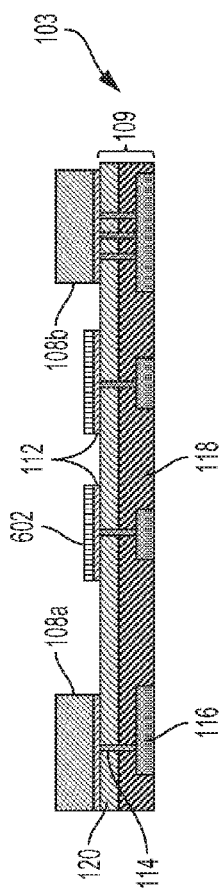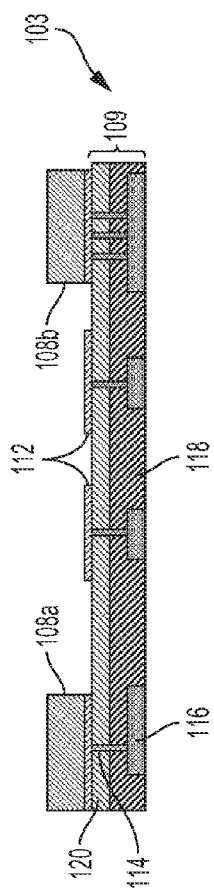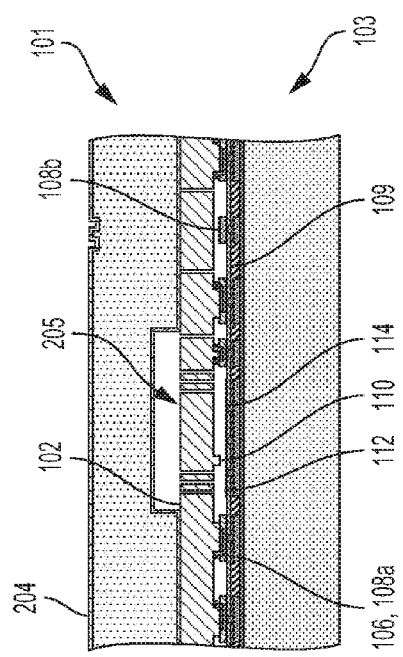

MEMS-CMOS DEVICE THAT MINIMIZES OUTGASSING AND METHODS OF MANUFACTURE

CROSS-REFERENCE TO RELATED APPLICATIONS

This application is a divisional of U.S. patent application Ser. No. 14/748,012, filed on Jun. 23, 2015, entitled "MEMS-CMOS DEVICE THAT MINIMIZES OUTGASSING AND METHODS OF MANUFACTURE," which claims benefit under 35 USC 119(e) of U.S. Provisional Patent Application No. 62/109,476, filed on Jan. 29, 2015, entitled "METHOD OF FABRICATING A CONDUCTIVE BUMPSTOP AND SEALED CMOS IN A VERTICALLY INTEGRATED MEMS STRUCTURE," all of which are incorporated herein by reference in their entireties.

FIELD OF THE INVENTION

The present invention relates generally to MEMS structures and more particularly to providing a MEMS structure which minimizes outgassing.

BACKGROUND

Microelectromechanical systems (MEMS) devices that include MEMS and CMOS contact surfaces that are conductive. Typically the MEMS devices also include an actuator layer therewithin. It is desirable to improve on processes that are utilized to provide such devices. It is also desirable to improve critical dimension control of the actuator layer as the MEMS device is reduced in size.

Therefore, there is a strong need for a solution that overcomes the aforementioned issues. The present invention addresses such a need.

SUMMARY

A MEMS device is disclosed. The MEMS device includes a first substrate. At least one structure is formed within the first substrate. The first substrate includes at least one first conductive pad thereon. The MEMS device also includes a second substrate. The second substrate includes a passivation layer. The passivation layer includes a plurality of layers. A top layer of the plurality of layers comprises an outgassing barrier layer. At least one second conductive pad and at least one electrode are coupled to the top layer. At least one first conductive pad is coupled to the at least one second conductive pad.

A first method of providing a MEMS device is disclosed. The method includes providing a passivation layer on a base substrate. The passivation layer comprises an outgassing barrier. The method also includes providing at least one conductive via through the passivation layer and providing a patterned metal layer on the passivation layer. The patterned metal layer is electrically coupled to at least one interconnect metal in the base substrate through the conductive via, wherein the patterned metal layer includes at least one conductive contact layer thereon. Finally, the method includes bonding the base substrate to another substrate. The another substrate includes at least one standoff thereon. The at least one standoff is coupled to the patterned metal layer.

A second method of providing a MEMS device is disclosed. The method includes providing a passivation layer on a base substrate. Passivation includes at least one patterned interconnect metal wherein the passivation layer includes a first material that causes outgassing and a second material coupled to the first material that minimizes outgassing. The passivation is deposited over at least one interconnect metal layer. The method also includes etching the passivation layer to provide at least one conductive via through the passivation layer and to the at least one interconnect metal layer. Next, the method includes providing a plurality of conductive pads on the passivation layer (on top of via). The plurality of conductive pads are electrically coupled to the at least one interconnect metal through the conductive via. The method then includes depositing and patterning at least one conductive metal contact (TiN) on at least one of the conductive pads. Finally, the method includes bonding the base substrate to another substrate. The another substrate includes at least one standoff thereon. The at least one standoff is coupled to the at least one conductive metal contact.

A third method of providing a MEMS device is disclosed. The method includes providing a passivation layer on a base substrate. The passivation layer comprises an outgassing barrier. The method also includes providing at least one conductive via through the passivation layer and providing a patterned metal layer on the passivation layer. The patterned metal layer is electrically coupled to at least one interconnect metal in the base substrate through the conductive via. The method then includes etching a second via in the passivation layer and depositing and patterning the conductive contacts or sensing electrodes which are electrically connected to the interconnect metal in the base substrate through the via. Finally, the method includes bonding the base substrate to another substrate. The another substrate includes at least one standoff thereon. The at least one standoff is coupled to the patterned metal layer.

BRIEF DESCRIPTION OF THE DRAWINGS

FIGS. 3A-3G is a first embodiment of a process flow for a CMOS-MEMS bonded sensor.

FIGS. 6A-6G is a fourth embodiment of a process flow for a CMOS-MEMS bonded sensor.

DETAILED DESCRIPTION

Figure 1:
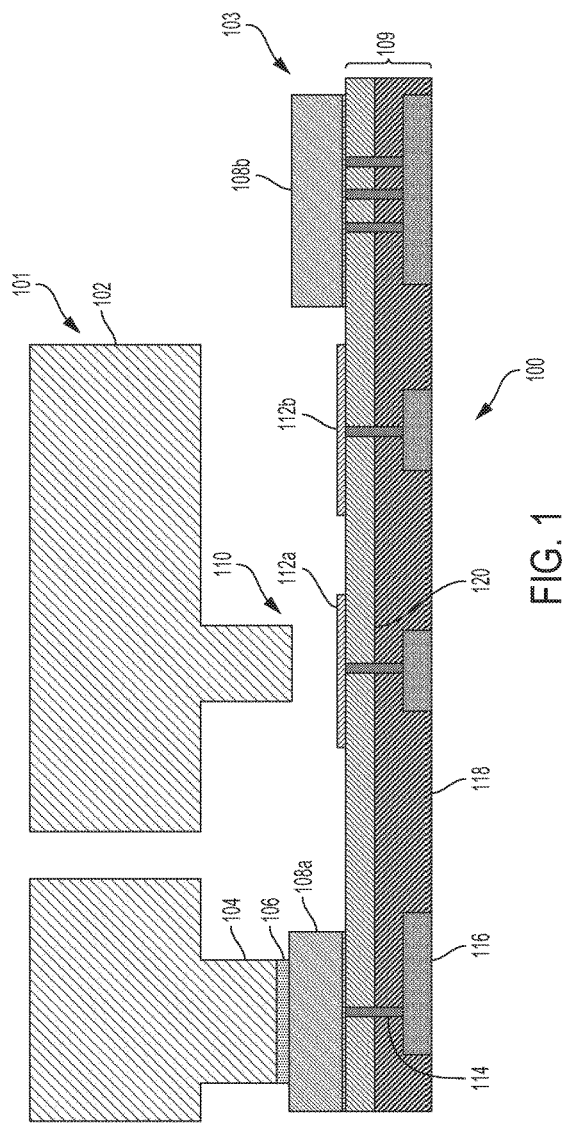
FIG. 1 is a cross section highlighting features of an embodiment of a CMOS wafer.

The present invention relates generally to MEMS structures and more particularly to providing a MEMS structure which minimizes outgassing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

In MEMS devices, a port is an opening through a substrate to expose MEMS structure to the surrounding environment. A chip includes at least one substrate typically formed from a semiconductor material. A single chip may be formed from multiple substrates, wherein the substrates are mechanically bonded to preserve functionality. Multiple chips include at least two substrates, wherein the at least two substrates are electrically connected but do not require mechanical bonding.

Typically, multiple chips are formed by dicing wafers. MEMS wafers are silicon wafers that contain MEMS structures. MEMS structures may refer to any feature that may be part of a larger MEMS device. One or more MEMS features comprising moveable elements is a MEMS structure. MEMS features may refer to elements formed by a MEMS fabrication process such as bump stop, damping hole, via, port, plate, proof mass, standoff, spring, and seal ring.

MEMS substrates provide mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. Bonding may refer to methods of attaching and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An IC substrate may refer to a silicon substrate with electrical circuits, typically CMOS circuits. A package provides electrical connection between bond pads on the chip to a metal lead that can be soldered to a printed board circuit (PCB). A package typically comprises a substrate and a cover.

FIG. 1 is a cross section highlighting features of an embodiment of a CMOS-MEMS device 100 in accordance with the present invention. The CMOS-MEMS device 100 includes a MEMS substrate 101 and a CMOS substrate 103. The MEMS substrate 101 includes an actuator 102. The MEMS substrate 101 also includes a standoff 104 and a vertical stop 110. The standoff 104 includes a conductive bond metal 106 thereon.

The CMOS substrate 103 includes a passivation layer 109. The passivation layer 109 includes a first portion 118 and a second portion 120 on top of the first portion. In an embodiment, the first portion 118 of passivation layer 109 comprises a source material that outgasses thereby increasing the pressure in a cavity formed in the device 100. Typically the source material includes but is not limited any of high density plasma oxides (HDP) and interlayer dielectric materials. Therefore in a device in accordance with an embodiment, the second portion 120 of the passivation layer 109 reduces outgassing and therefore acts a barrier layer by completely covering the first portion 118. The barrier layer material includes but is not limited to silicon nitride and aluminum oxide. By completely covering the outgassing source material with an outgassing barrier layer outgassing can be reduced and therefore lower cavity pressure is achieved for MEMS sensors such as for a gyroscope.

The CMOS substrate 103 also includes an interconnect metal 116 within a first portion 118 of the passivation layer 109. A via 114 is provided through the passivation layer 109. The CMOS substrate 103 includes bond pads 108a and 108b. The vias 114 allow for electrical connection from the interconnect metal 116 to one of the bond pads 108a. The metal used in the vias 114 can include but is not limited to tungsten (W), Titanium (TI), Tantalum (Ta), and copper (Cu).

As can be seen the bond pad 108a is coupled to bond metal 106 of the MEMS substrate 101. In an embodiment the bond pad 108a comprises aluminum and the bond metal 106 comprises germanium. Finally the CMOS substrate 103 includes one or more electrodes 112. Each of the electrodes 112a and 112b are coupled to one of the interconnect metals 116 via at least one via 114. Electrode 112a acts as a contact surface for the vertical stop 110. The electrode 112 material can include but are not limited to any of Titanium Nitride (TiN) and Tantalum Nitride (TaN).

Figure 2:
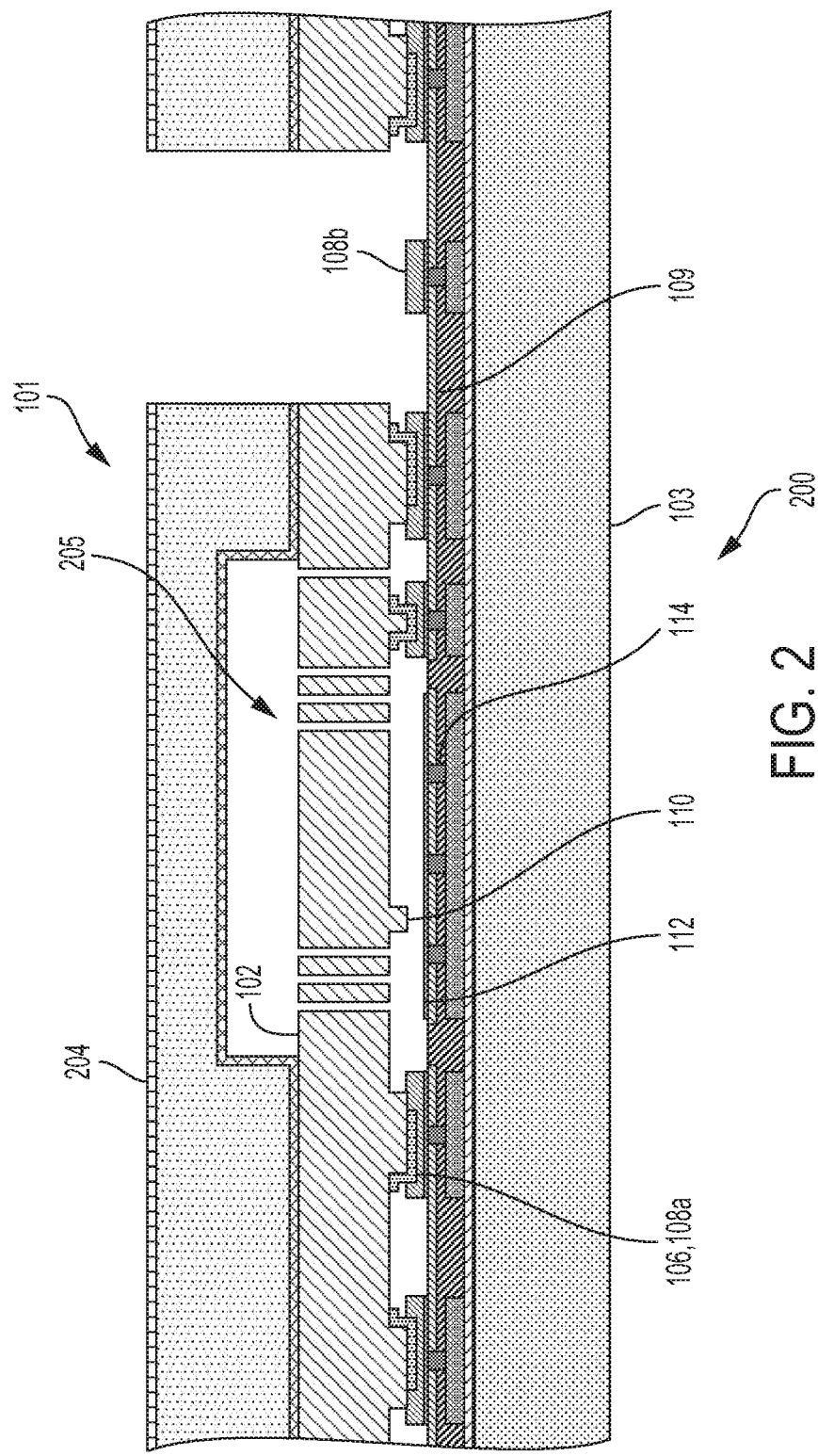
FIG. 2 is a cross section of CMOS-MEMS bonded sensor including features disclosed in FIG. 1.

FIG. 2 is a cross section of CMOS-MEMS bonded sensor 200 including features disclosed in FIG. 1. The sensor 200 includes a handle layer 204 and includes a cavity 205 therein.

Manufacturing a device in accordance with the present invention reduces the number of mask layers needed to provide MEMS and CMOS contact surfaces that are both conductive. Also with a device in accordance with the present lower cavity pressure can be achieved since outgassing materials are covered by outgassing barrier material. Lastly, since an actuator to electrode sensing capacitive gap includes both bonding metal thickness and standoff height, less standoff height is required for achieving the same capacitive gap. The reduction of the standoff height will improve the critical dimension control of moving structures because of reduced topography on the surface where the moving structures are defined.

Methods are disclosed herein below to provide the device described in FIGS. 1 and 2. To describe these methods in more detail refer to the following description in conjunction with the accompanying Figures.

FIGS. 3A-3G is a first embodiment of a process flow for a CMOS-MEMS bonded sensor. As seen in FIG. 3A, after an oxide layer 118 is deposited and planarized on top of interconnect metal 116, an outgassing barrier layer 120 is deposited thereon to begin formation of the CMOS substrate 103. Next as shown in FIG. 3B, vias 114 are formed through the passivation layer 109 to the interconnect metal 116. Next a top metal layer 108 is deposited and patterned a shown in FIG. 3C. Thereafter as shown in FIG. 3D a contact surface 112 is deposited and patterned. Separately, in FIG. 3E, the MEMS substrate 101 is etched to provide a standoff 104 and a vertical travel stop 110. Next, a conductive bond pad 106 is provided on the standoff 104 and an actuator 102 is etched as shown in FIG. 3F. Thereafter as shown in FIG. 3G, a conductive bond pad 106 of the MEMS substrate 101 is coupled to the metal bond pad 108a of the CMOS substrate 103.

Figure 4A:
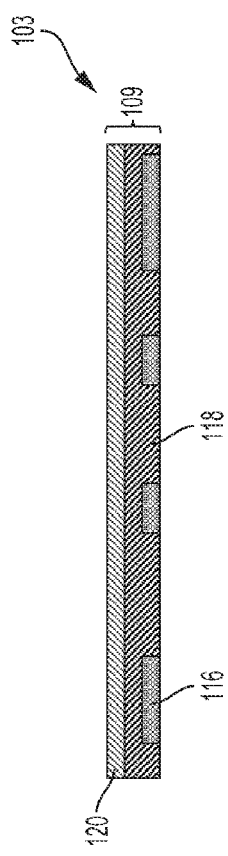
FIGS. 4A-4E is a second embodiment of a process flow for a CMOS-MEMS bonded sensor.
Figure 4B:
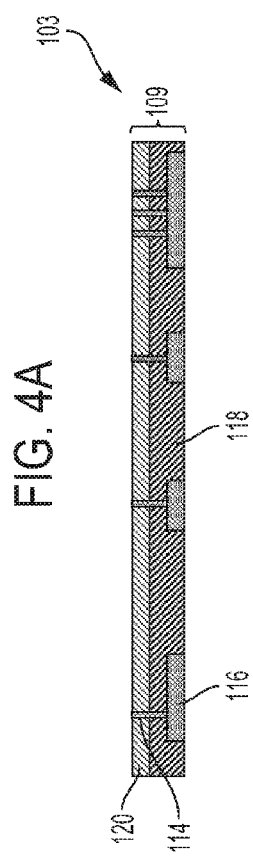
Figure 4C:
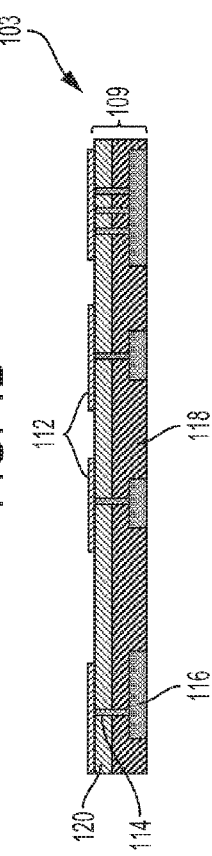
Figure 4D:
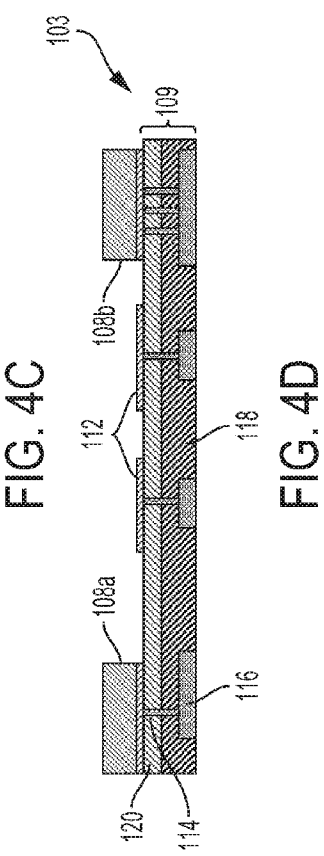
Figure 4E:
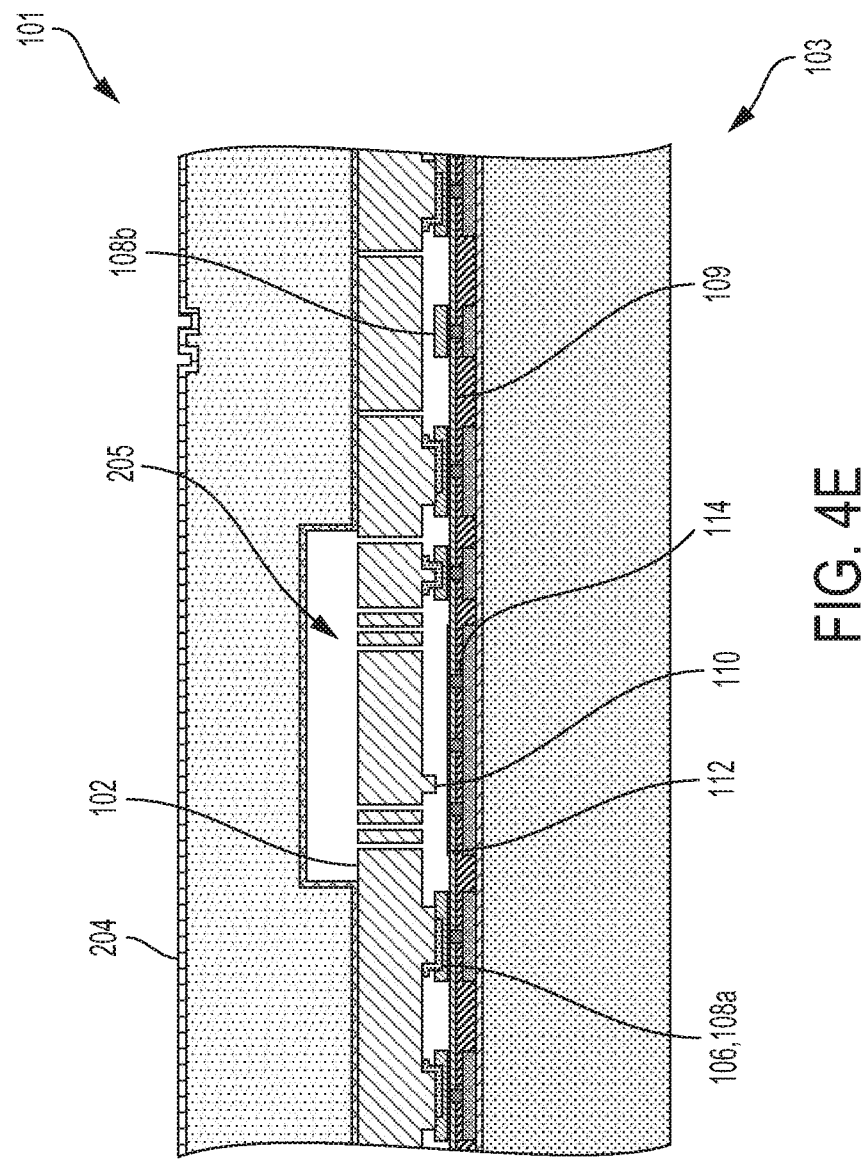

FIGS. 4A-4E is a second embodiment of a process flow for a CMOS-MEMS bonded sensor. As is seen in FIG. 4A, a CMOS substrate 103 is shown with the passivation layer 109 and the interconnect metal 116 therewithin. Thereafter, vias 114 are formed by etching the passivation layer as seen in FIG. 4B. Thereafter, the electrodes and contact layers 112 are formed via a deposition and etch process as shown in FIG. 4C. In FIG. 4D, the metal bond pads 108a and 108b are deposited and selectively wet etched. Thereafter, as shown in FIG. 4E, the conductive bond pad 106 of the MEMS substrate 101 is coupled to the metal bond pads 108a of the CMOS substrate 103.

Figure 5A:
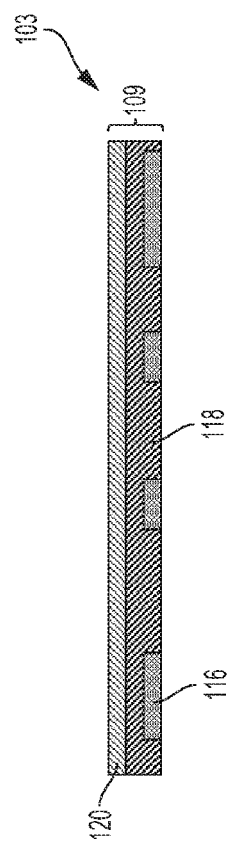
FIGS. 5A-5F is a third embodiment of a process flow for a CMOS-MEMS bonded sensor.
Figure 5B:
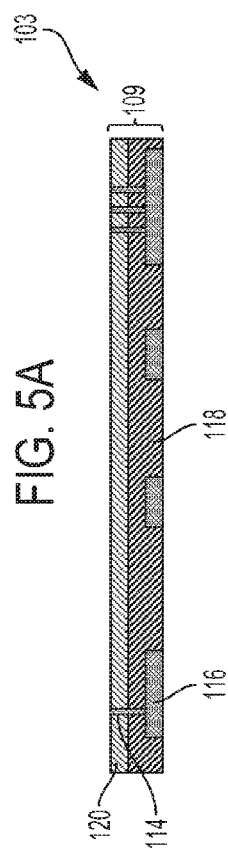
Figure 5C:
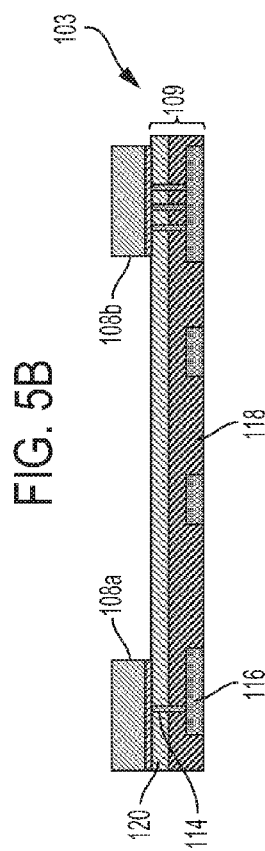
Figure 5D:
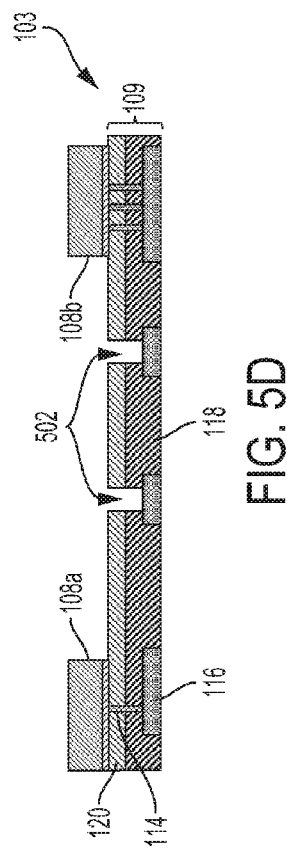
Figure 5E:
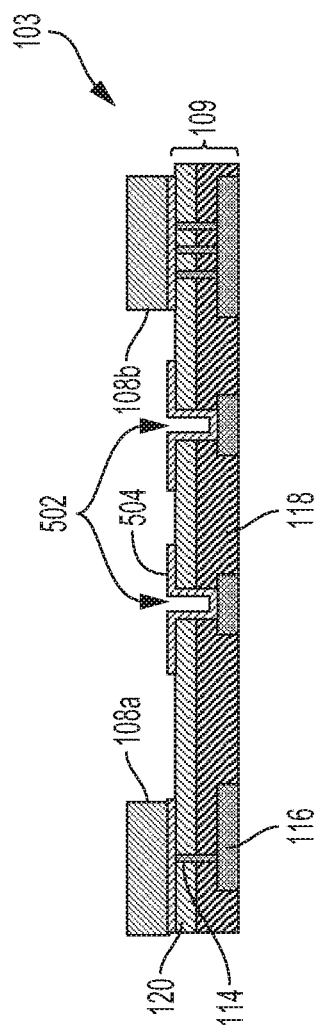
Figure 5F:
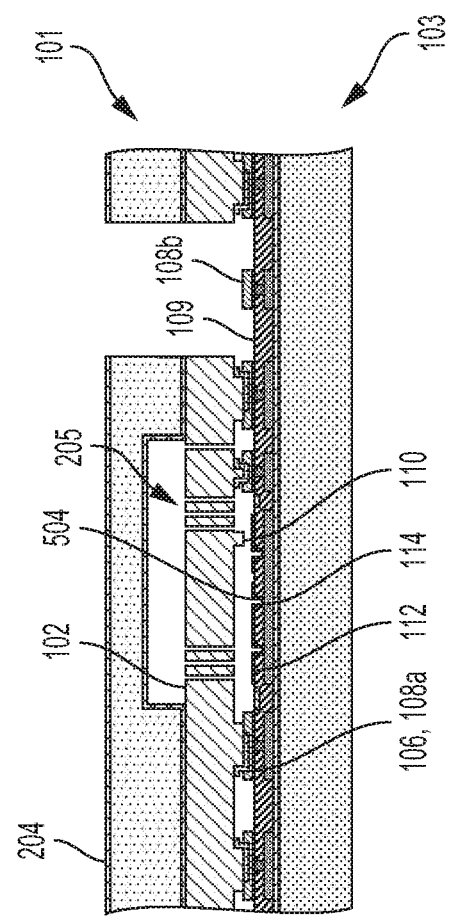

FIGS. 5A-5F is a third embodiment of a process flow for a CMOS-MEMS bonded sensor. As is seen in FIG. 5A, a CMOS substrate 103 is shown with the passivation layer 109 and the interconnect metal 116 therewithin. Thereafter, first vias 114 are formed by etching the passivation layer 109 and filled with a conductive metal as seen in FIG. 5B. Next, the metal bond pads 108a and 108b are deposited and etched in FIG. 5C. Thereafter, second vias 502 are etched through the passivation layer 109 to the interconnect metal 116 seen in FIG. 5D. Thereafter, as seen in FIG. 5E is a contact and electrode layer 504 is deposited and etched to form electrical connection to the interconnect metal 116 through the second vias 502. Finally, as shown in FIG. 5F, the conductive bond pad 106 of the MEMS substrate 101 is coupled to the metal bond pads 108a of the CMOS substrate 103.

FIGS. 6A-6G is a fourth embodiment of a process flow for a CMOS-MEMS bonded sensor. As is seen in FIG. 6A, a CMOS substrate 103 is shown with the passivation layer 109 and the interconnect metal 116 therewithin. Thereafter, vias 114 are formed by etching the passivation layer as seen in FIG. 6B. Thereafter, the contact and electrode layer 112 is formed via a deposition process as shown in FIG. 6C. Next, an etch stop layer 602 is deposited and patterned that defines the electrode and a contact surface as shown in FIG. 6D. In FIG. 6E, the bond metal is deposited and patterned stopping on the etch stop layer 602. Next, as shown in FIG. 6F, the etch stop layer 602 is removed. Thereafter, as shown in FIG. 6G, the conductive bond pad 106 of the MEMS substrate 101 is coupled to the metal bond pads 108a of the CMOS substrate 103.

A device and methods of manufacture disclosed herein in accordance with the present invention reduces the number of mask layers needed to provide MEMS and CMOS contact surfaces that are both conductive. In addition, a lower cavity pressure can be achieved within the device since any outgassing materials are entirely covered by an outgassing barrier material. Lastly, since the actuator to electrode sensing capacitive gap includes both bonding metal thickness and standoff height, less standoff height is required for achieving the same capacitive gap. The reduction of standoff height will improve the critical dimension control of one or more moving structures because of reduced topography on the surface where the one or more moving structures are defined.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method of providing a microelectromechanical device comprising:
   providing a passivation layer on a base substrate, wherein the passivation layer comprises an outgassing barrier;
   providing at least one conductive via through the passivation layer;
   providing a patterned metal layer on the passivation layer, wherein the patterned metal layer is electrically coupled to at least one interconnect metal in the base substrate through the conductive via, and wherein the patterned metal layer includes at least one conductive contact layer on the patterned metal layer.

2. The method of claim 1, further comprising:
   bonding the base substrate to a second substrate, wherein the second substrate comprises at least one standoff on the second substrate.

3. The method of claim 2, wherein the at least one standoff is coupled to the patterned metal layer.

4. The method of claim 1, wherein the at least one conductive via comprises at least one of copper or tungsten.

5. The method of claim 2, further comprising:
   depositing Germanium on the at least one standoff prior to the bonding.

6. A method of providing a microelectromechanical device comprising:
   providing a passivation layer on a base substrate, wherein the passivation comprises at least one patterned interconnect metal, wherein the passivation layer comprises a first material that causes outgassing and a second material that reduces outgassing, wherein the second material is coupled to the first material, and wherein the first material comprises at least one interconnect metal;
   etching the passivation layer to provide at least one conductive via through the passivation layer and to the at least one interconnect metal;
   providing a plurality of conductive pads on the passivation layer, wherein the plurality of conductive pads are electrically coupled to the at least one interconnect metal through the conductive via;
   depositing and patterning at least one conductive metal contact on at least one of the conductive pads; and
   bonding the base substrate to a second substrate, wherein the second substrate comprises at least one standoff on the second substrate and wherein the at least one standoff is coupled to the at least one conductive metal contact.

7. The method of claim 6, wherein the providing at least one conductive metal contact further comprises depositing and patterning a metal layer prior to depositing the plurality conductive pads.

8. The method of claim 7, further comprising:
   selectively wet etching the metal layer to expose the at least one conductive metal contact.

9. The method of claim 6, wherein the providing the plurality of conductive pads further comprises depositing an electrode layer on the second material.

10. The method of claim 9, wherein the providing the plurality of conductive pads further comprises depositing and patterning an etch stop pad on the electrode layer over the at least one conductive via.

11. The method of claim 10, wherein the providing the at least one conductive metal contact further comprises depositing and patterning a metal layer on the plurality of conductive pads utilizing the etch stop pad as a stop for the patterning.

12. The method of claim 11, wherein the providing the at least one conductive metal contact further comprises removing the etch stop pad to form the at least one conductive metal contact or at least one electrode.

13. A method of providing a microelectromechanical device comprising:
   providing a passivation layer on a base substrate;
   providing at least one first conductive via through the passivation layer;
   providing a patterned metal layer on the passivation layer, wherein the patterned metal layer is electrically coupled to at least one interconnect metal layer in the base substrate through the conductive via;
   etching a second conductive via in the passivation layer;
   depositing a conductive connector within the second conductive via to provide electrical connection between the conductive connector and the interconnect metal layer in the base substrate; and
   bonding the base substrate to a second substrate.

14. The method of claim 13, wherein the second substrate comprises at least one standoff on the second substrate.

15. The method of claim 14, wherein the at least one standoff is coupled to the patterned metal layer.

16. The method of claim 13, wherein the conductive connector serves as an electrode.

17. The method of claim 13, wherein the conductive connector serves as a conductive contact surface making contact with a vertical stop.

18. The method of claim 17, wherein the vertical stop is on the second substrate.

19. The method of claim 13, wherein the passivation layer comprises an outgassing barrier.

* * * * *